US008549740B1

(12) United States Patent
Hwu et al.

(10) Patent No.: US 8,549,740 B1
(45) Date of Patent: Oct. 8, 2013

(54) METHOD OF MANUFACTURING A FOLDED WAVEGUIDE

(75) Inventors: Ruey-Jen Hwu, Salt Lake City, UT (US); Laurence P. Sadwick, Salt Lake City, UT (US); Jehn-Huar Chern, Salt Lake City, UT (US)

(73) Assignee: InnoSys, Inc, Salt Lake City, UT (US)

( * ) Notice: Subject to any disclaimer, the term of this patent is extended or adjusted under 35 U.S.C. 154(b) by 1070 days.

(21) Appl. No.: 12/479,153

(22) Filed: Jun. 5, 2009

Related U.S. Application Data

(60) Provisional application No. 61/059,190, filed on Jun. 5, 2008.

(51) Int. Cl.
*H05K 3/20* (2006.01)

(52) U.S. Cl.
USPC ................. 29/831; 29/600; 29/852; 315/305; 333/135

(58) Field of Classification Search
USPC ............ 205/641; 315/3.5, 3.6, 5.41; 333/26, 333/135, 156; 29/830, 831, 846, 847, 852, 29/600
See application file for complete search history.

(56) References Cited

U.S. PATENT DOCUMENTS 4,309,951 A * 1/1982 Supik et al. .................. 205/641
4,695,766 A * 9/1987 Waterman ...................... 315/3.5
7,233,216 B2 * 6/2007 Kato et al. ...................... 333/26
7,504,039 B2 3/2009 Sadwick

* cited by examiner

*Primary Examiner* — Donghai D. Nguyen
(74) *Attorney, Agent, or Firm* — Hamilton, DeSanctis & Cha LLP

(57) ABSTRACT

Various folded waveguides and methods of manufacturing waveguides are disclosed herein. For example, some embodiments provide a method of manufacturing a folded waveguide including machining a plate with a number of registration marks and forming at least one slow wave circuit in at least two halves on the plate. A portion of the registration marks are for the plate and another portion are for the at least one slow wave circuit. The method also includes connecting the at least two halves of the at least one slow wave circuit and machining the at least one slow wave circuit.

18 Claims, 14 Drawing Sheets

METHOD OF MANUFACTURING A FOLDED WAVEGUIDE

CROSS REFERENCE TO RELATED APPLICATION

The present application claims priority to U.S. Provisional Patent Application No. 61/059,190 entitled "Slow Wave Structures", and filed on Jun. 5, 2008. The aforementioned application is assigned to an entity common hereto, and the entirety of the aforementioned application is incorporated herein by reference for all purposes.

BACKGROUND

Microwave electronic devices, sometimes referred to as radio frequency (RF) devices, perform a number of extremely important functions such as in radars and high speed communications systems, etc. A number of physical structures such as waveguides and various types of amplifiers are used to direct and modify the electromagnetic RF signals that are typically within a range of around 0.3 GHz to above 300 GHz. Folded waveguides are devices that guide an RF signal along a meandering path to introduce a delay or a phase shift in the signal, sometimes needed in an amplifier. For example, a traveling wave tube (TWT) is a vacuum device that amplifies the gain, power or some other characteristic of an RF signal by causing an electron beam to interact with and transfer energy to the RF signal. The gain is typically increased when the axial velocity of the RF signal closely matches the axial velocity of the electron beam. A magnetic field may be used to steer and focus the electron beam into a straight and narrow line so that it doesn't directly touch the structure of the TWT. The folded waveguide may be used in the TWT to reduce the axial velocity of the RF signal so that it more nearly matches the velocity of the electron beam. The RF signal slows axially when it is forced to travel from side to side along the meandering path of the folded waveguide rather than just straight through the TWT alongside the electron beam. The folded waveguide thus delays the RF signal through the TWT, matching its axial velocity to that of the electron beam and maximizing the transfer of energy from the electron beam to the RF signal.

Folded waveguides can be difficult to manufacture because of the high speed of RF signals. The dimensions of microwave devices are often dictated by the ultra-small wavelength of the RF signal, and manufacturing a device with many direction changes and extremely close tolerances remains a challenge.

SUMMARY

Various folded waveguides and methods of manufacturing waveguides are disclosed herein. For example, some embodiments provide a method of manufacturing a folded waveguide including machining a plate with a number of registration marks and forming at least one slow wave circuit in at least two halves on the plate. A portion of the registration marks are for the plate and another portion are for the at least one slow wave circuit. The method also includes connecting the at least two halves of the at least one slow wave circuit and machining the at least one slow wave circuit.

This summary provides only a general outline of some particular embodiments. Many other objects, features, advantages and other embodiments will become more fully apparent from the following detailed description, the appended claims and the accompanying drawings.

BRIEF DESCRIPTION OF THE DRAWINGS

A further understanding of the various embodiments may be realized by reference to the figures which are described in remaining portions of the specification. In the figures, like reference numerals may be used throughout several drawings to refer to similar components.

FIG. 7A is a cross-sectional side view with the cross-section taken between the two halves of FIGS. 6A and 6B, FIG. 7B is a top view, FIG. 7C is a bottom view, FIG. 7D is a left end view and FIG. 7E is a right end view.

FIG. 8A is a side view, FIG. 8B is a top view, FIG. 8C is a bottom view, FIG. 8D is a left end view, FIG. 8E is a right end view and FIG. 8F is a cross-sectional view.

FIG. 12A is a cross-sectional side view with the cross-section taken between the two halves of FIG. 11, and FIG. 12B is a left end view.

FIG. 13A is a side view, FIG. 13B is a top view, FIG. 13C is a bottom view, FIG. 13D is a left end view, FIG. 13E is a right end view and FIG. 13F is a cross-sectional view.

DESCRIPTION

Figure 1:
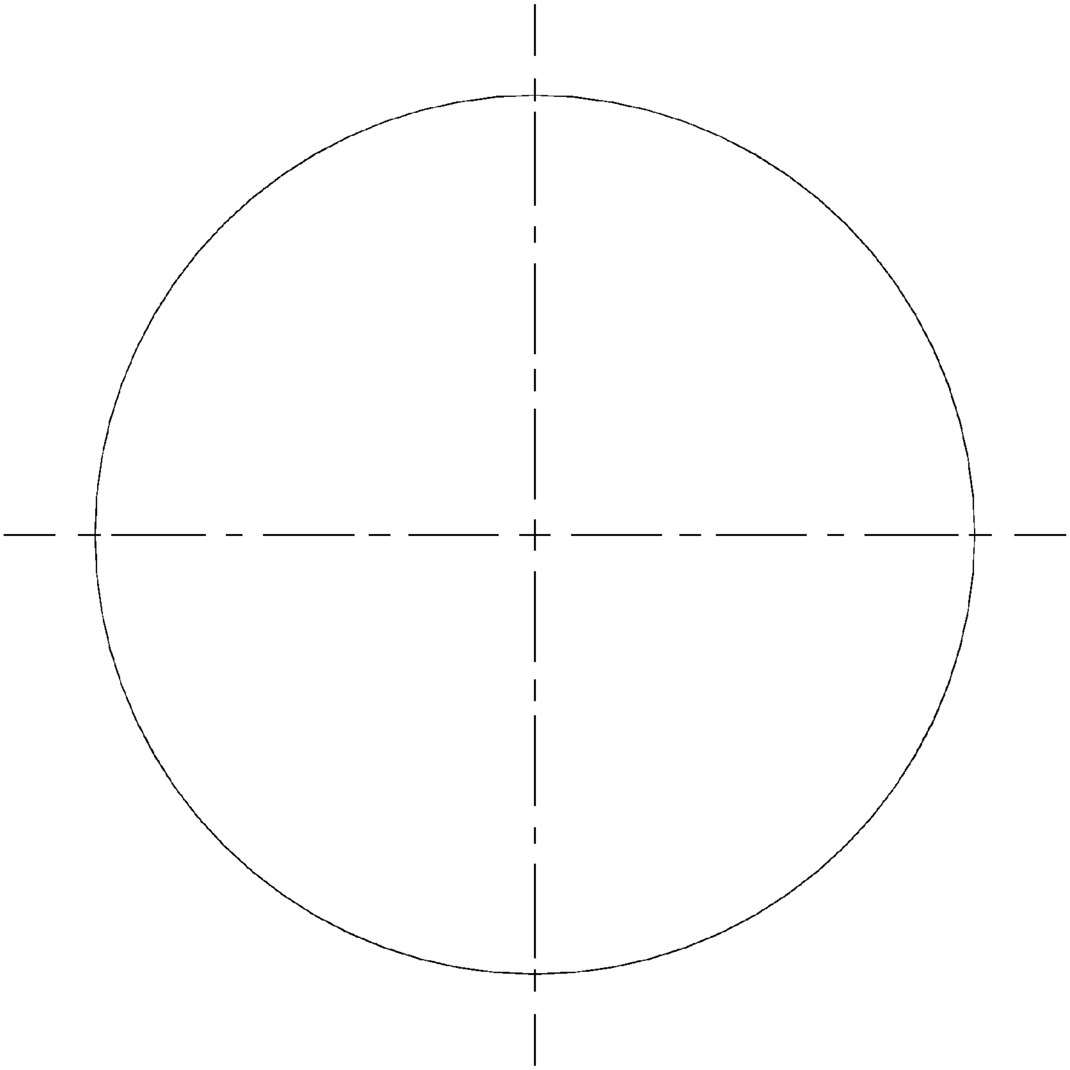
FIG. 1 depicts a disk sliced from rod stock during manufacturing of a folded waveguide in accordance with some embodiments of the invention.

The drawings and description, in general, disclose various embodiments of a folded waveguide and a method of manufacturing a folded waveguide and other types of waveguides. It is important to note that while the method of manufacturing disclosed herein provides substantial benefits to folded waveguides that are typically difficult to manufacture using conventional techniques, the method of manufacturing disclosed may be applied equally well to the manufacture of other types of microwave and other electronic devices.

Various slow wave structures (SWS) are candidates for use as a traveling wave tube (TWT) operated in the W-band and at other frequencies, including a folded waveguide, coupled cavity, and tunnel ladder. A folded waveguide has the ability to achieve high-power, wide bandwidth, and high gain in a reasonable length. It has a simple form that looks like a meandering line. Such SWS can be fabricated either by micro-machining or conventional precision machining. Unlike its counterpart, the coupled cavity SWS, a folded waveguide SWS can be made to desired length with no breaks which may simplify the fabrication steps and thus lower cost. The design of a W-band folded waveguide SWS takes into account gun characteristics and a periodic permanent magnet (PPM) stack in the interested band. Frequently, a working design calls for a waveguide that has a ratio of 10 between its a-side and b-side. Taking the approach of splitting the structure in half, one is dealing with an aspect ratio greater than 5 during machining. In addition to the high aspect ratio, there are challenging areas for each machining method to overcome. The device may be fabricated using micromachining using a process such as SU-8 application and electrolytic plating of copper. Precision machining may also be used using machine tools such as mills and drills or precision micromachining or a combination of the micromachining and precision machining techniques. Maintaining the alignment accuracy throughout the entire process, particularly when including both machining methods, is important. For an approach using only precision machining, material selections, machining procedure, brazing, and post brazing machining, need to be handled properly to make the SWS possible.

An exemplary flow process for a precision machined folded waveguide is shown below. Note that the frequency of intended operation for the folded waveguide can be from below a few GHz to above 100 GHz. Note also that the exemplary example shown below is just one illustration of how to make such a structure using precision machining and is not to be construed as limiting in any way or form for the instant invention disclosed here. It should be clear to anyone skilled in the art that a number of variations in process steps and flow could be used including changing and/or interchanging certain process steps while still achieving the intent of the present instant invention. Small and ultra-small machine drill bits with precisely formed shapes can be used to achieve the structural features required from the present instant invention. Such bits can be designed and made in the exact shape needed out of an appropriate material and/or alloy system. Special and specific alignment features can be used to insure the required accuracy and alignment of the structures and to facilitate assembly including brazing after the structures have been machined. Precision alignment pins can also be used to assist in the fabrication and assembly process. Such alignment structures which can include holes of various shapes (i.e., circular, rectangular, square, rectangular, etc.) can be designed and made to support both the precision machining and the subsequent assembly including brazing. Post machining can also be done, for example, before intermediate and/or final assembly.

The example shown below using a rod to cut out a circular cross section should be viewed as one method and way to accomplish the present invention; certainly other ways and shapes including square, rectangular cross sections could be used and certainly more than one folded waveguide structure or set of structures could be precision machined on the same starting plate/substrate.

Figure 2:
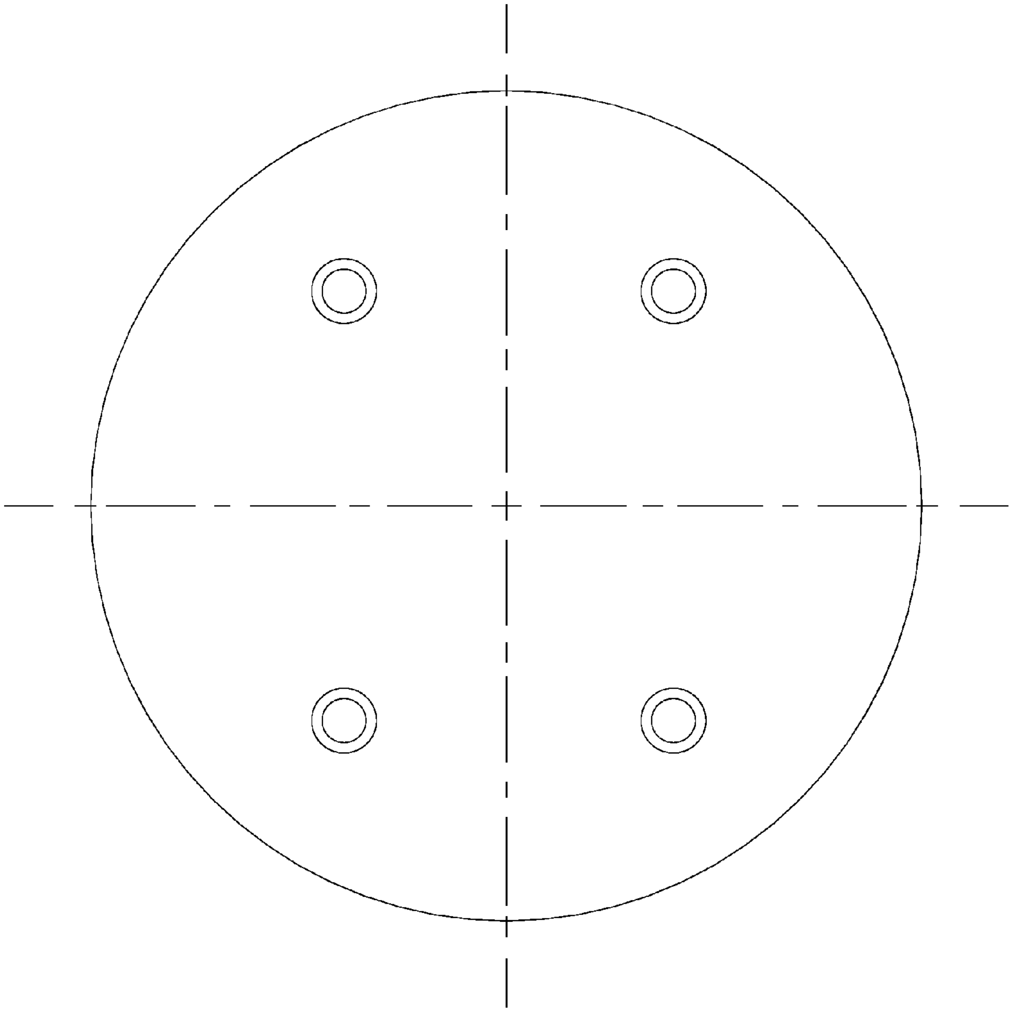
FIG. 2 depicts a flattened, lapped disk with a holding mechanism fashioned during manufacturing of a folded waveguide in accordance with some embodiments of the invention.
Figure 3:
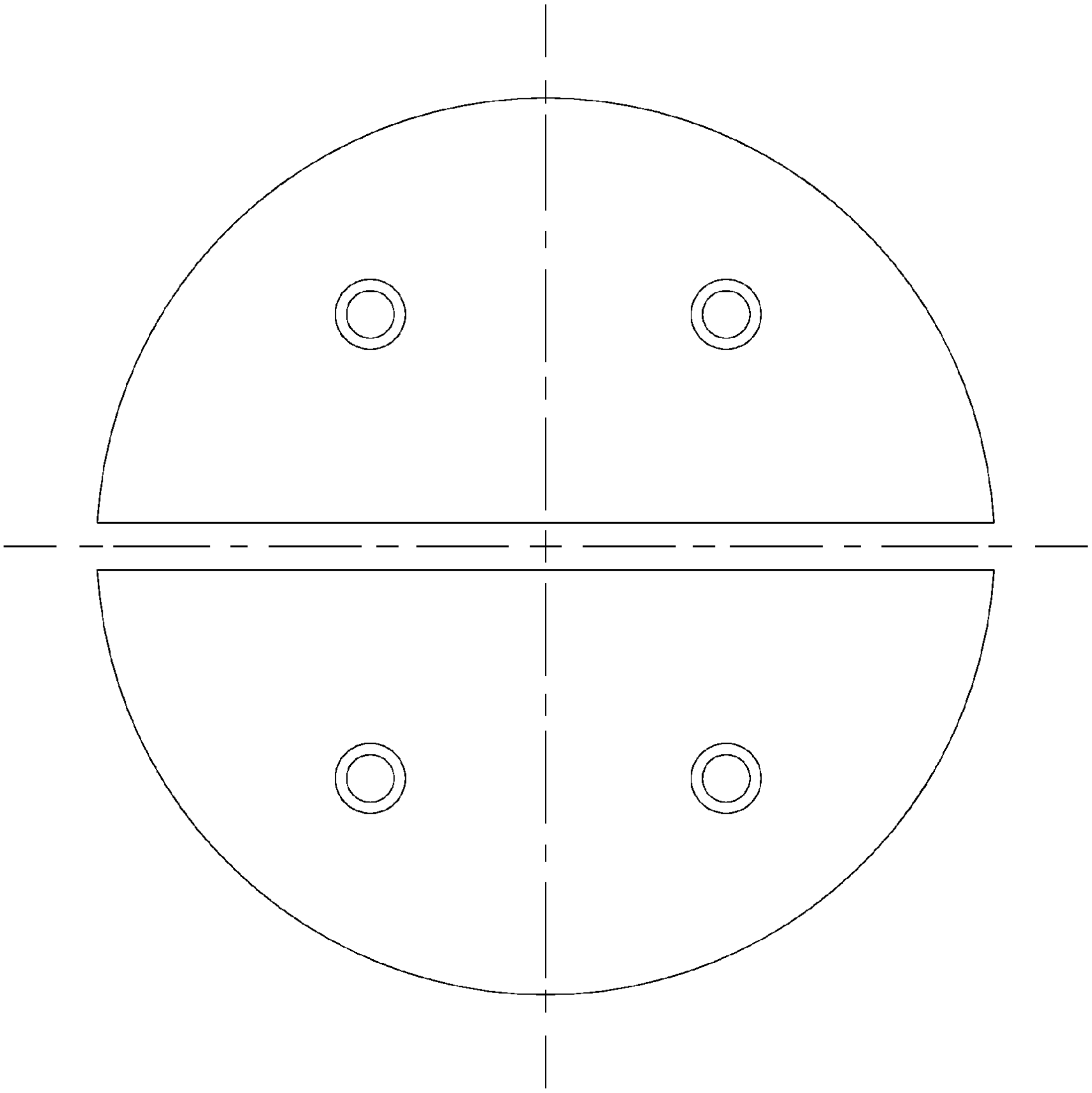
FIG. 3 depicts the disk of FIG. 2 cut in half during manufacturing of a folded waveguide in accordance with some embodiments of the invention.
Figure 4:
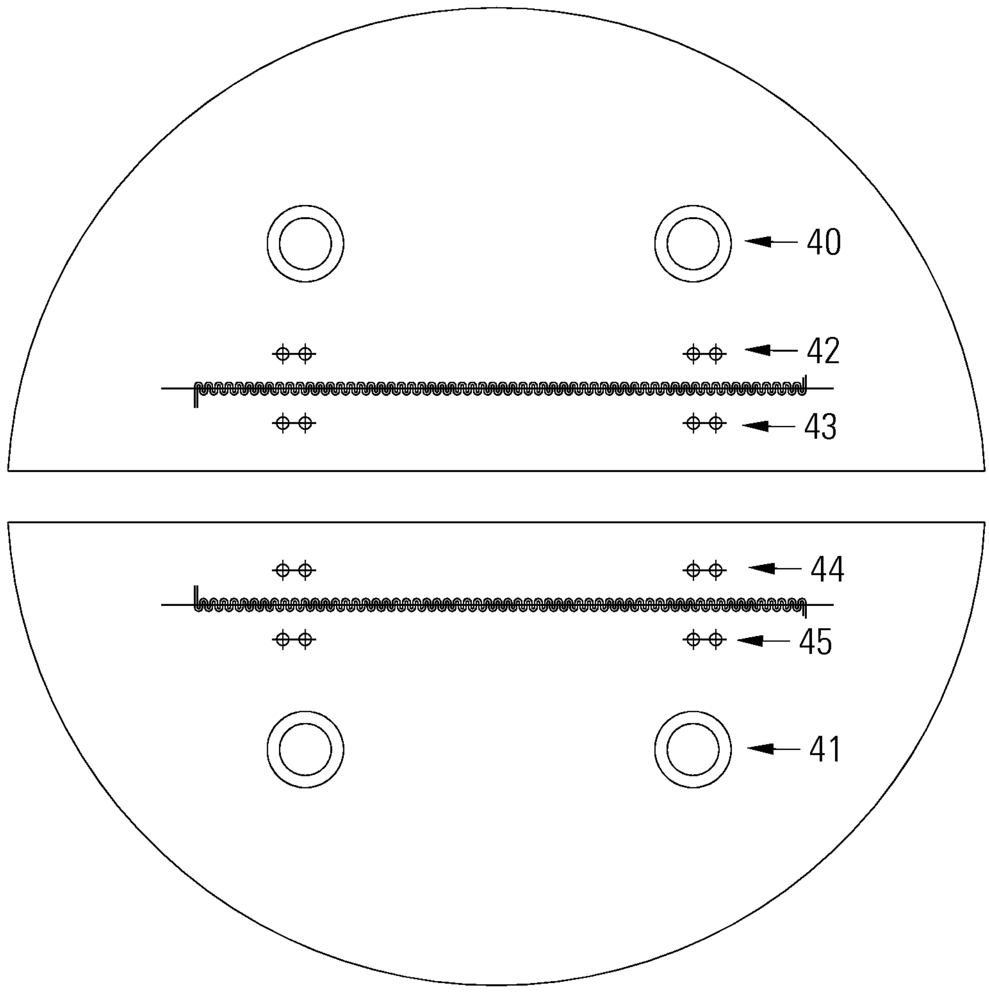
FIG. 4 depicts the disk of FIG. 3 with slow wave structures 46, 47 and individual holding mechanisms with plate registration marks 40, 41 and individual half-waveguide registration marks 42, 43, 44, 45 fashioned during manufacturing of a folded waveguide in accordance with some embodiments of the invention.
Figure 5A:
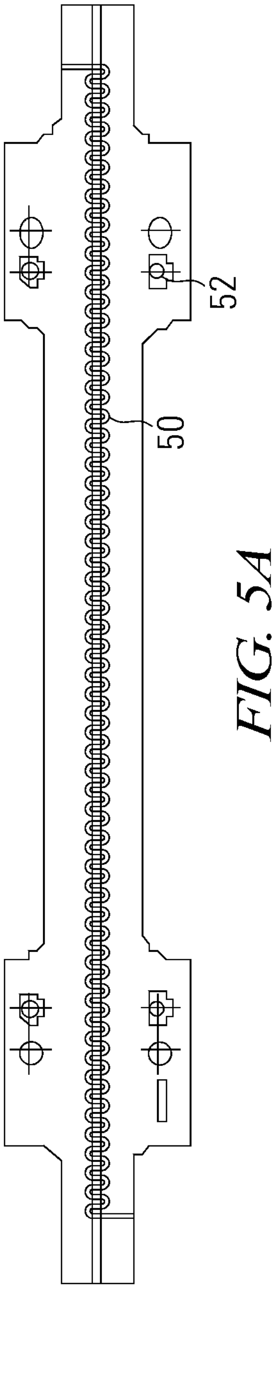
FIGS. 5A and 5B depict two halves of a slow wave structure 50, 51 with pin holes 52, 53 as pared from the disk of FIG. 4 during manufacturing of a folded waveguide in accordance with some embodiments of the invention.
Figure 5B:
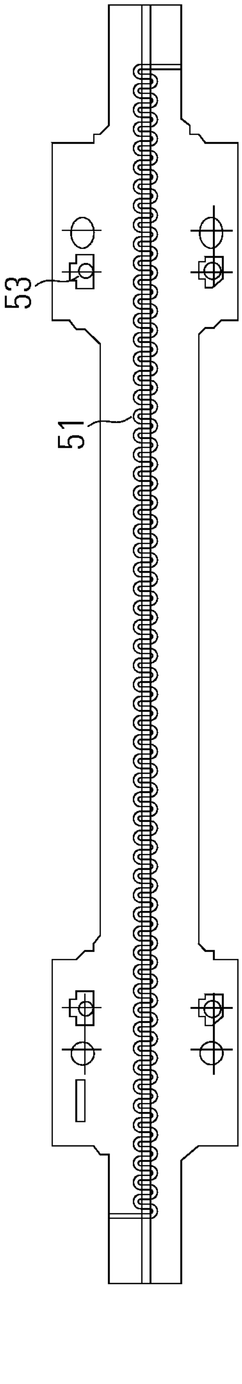
Figure 6A:
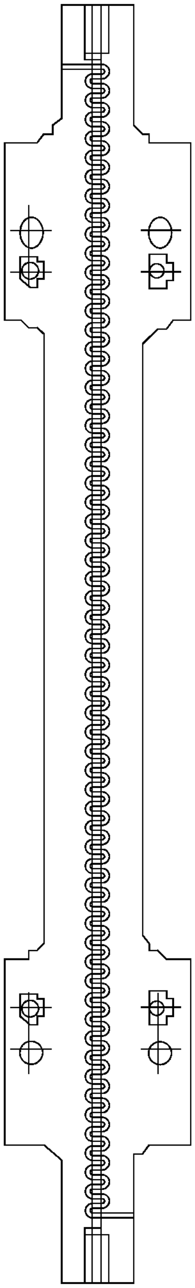
FIGS. 6A and 6B depict the two halves of the slow wave structure of FIGS. 5A and 5B having been chemically deburred and having been turned on a lathe at RF port ends during manufacturing of a folded waveguide in accordance with some embodiments of the invention.
Figure 6B:
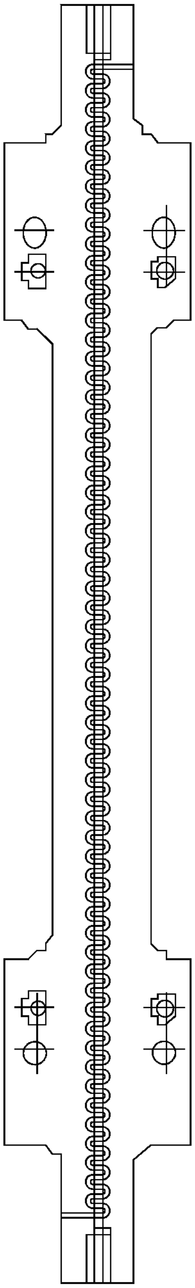
Figure 7E:
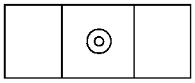
Figure 7B:
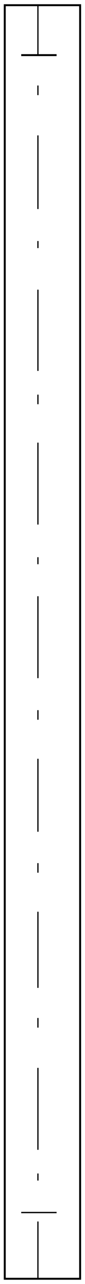
FIGS. 7A-7D depict various views of the slow wave structure of FIGS. 6A and 6B after brazing during manufacturing of a folded waveguide in accordance with some embodiments of the invention, where
Figure 7A:
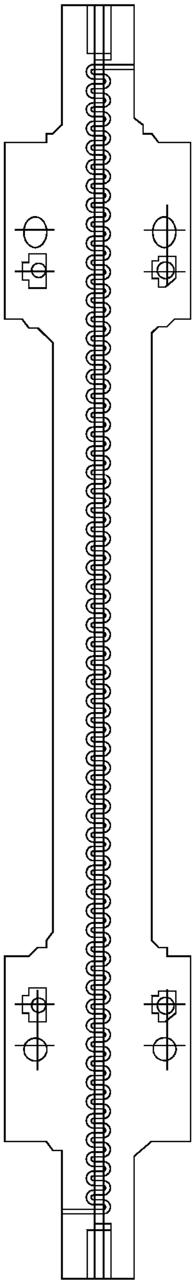
Figure 7C:
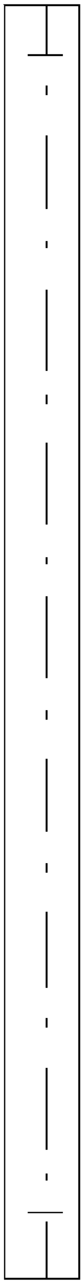
Figure 7D:
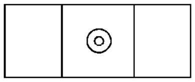
Figure 8E:
FIGS. 8A-8E depict various views of the slow wave structure of FIGS. 6A and 6B after post-brazing machining during manufacturing of a folded waveguide in accordance with some embodiments of the invention, where
Figure 8B:
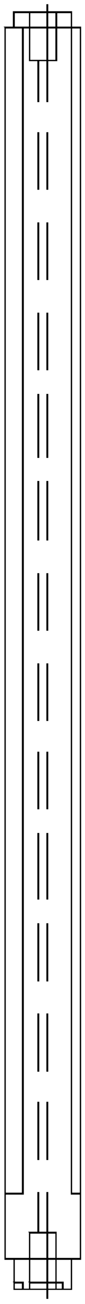
Figure 8A:
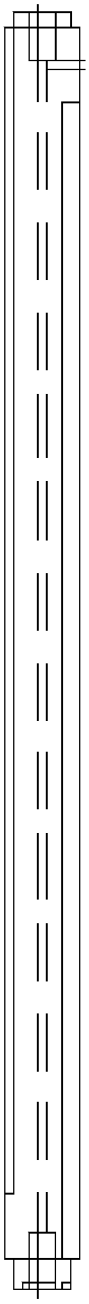
Figure 8C:
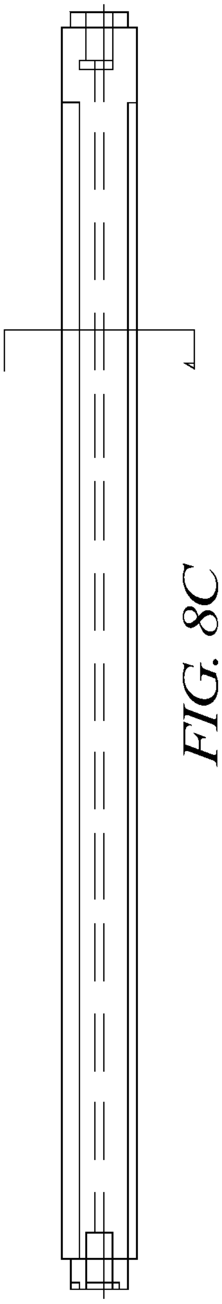
Figure 8F:
Figure 8D:
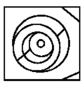
Figure 9:
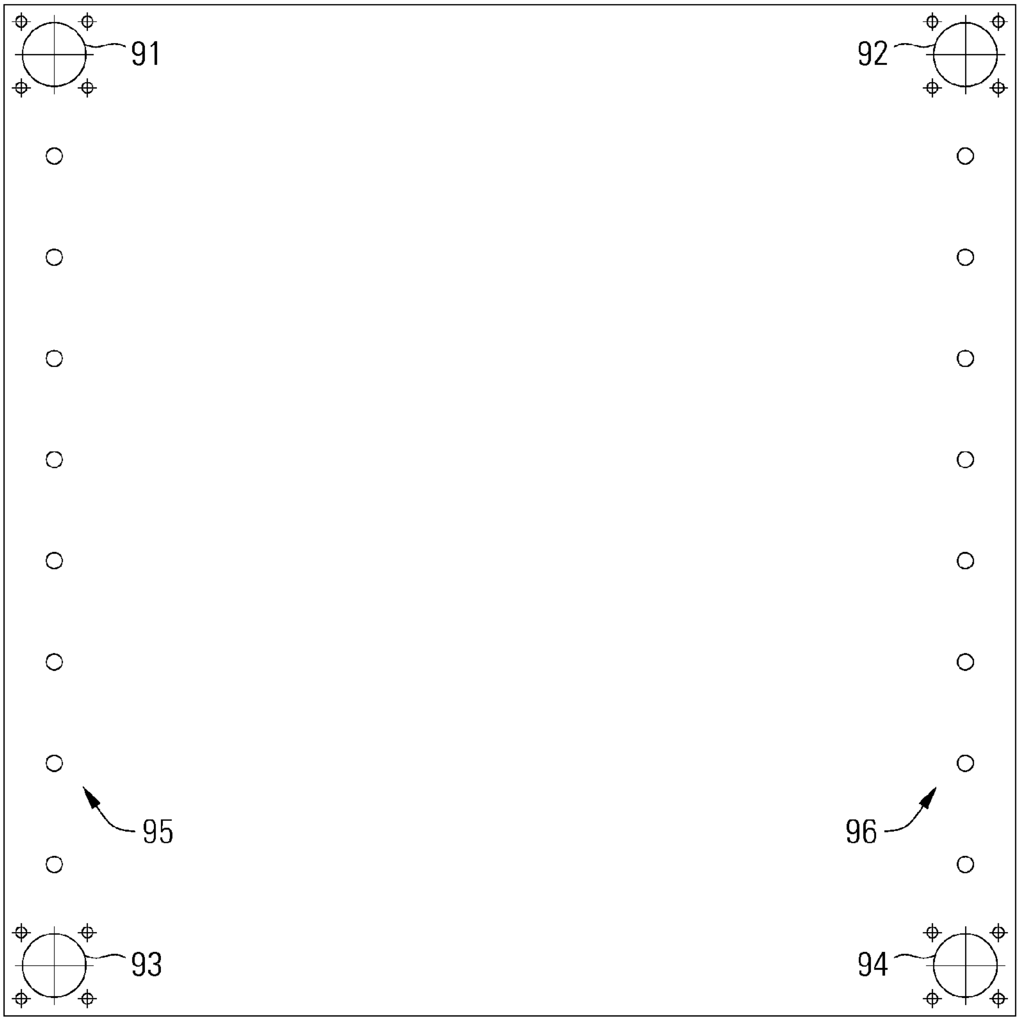
FIG. 9 depicts plate stock with plate registration marks 91, 92, 93, 94 and individual half-waveguide registration marks 95, 96 during manufacturing of a folded waveguide in accordance with some embodiments of the invention.
Figure 10:
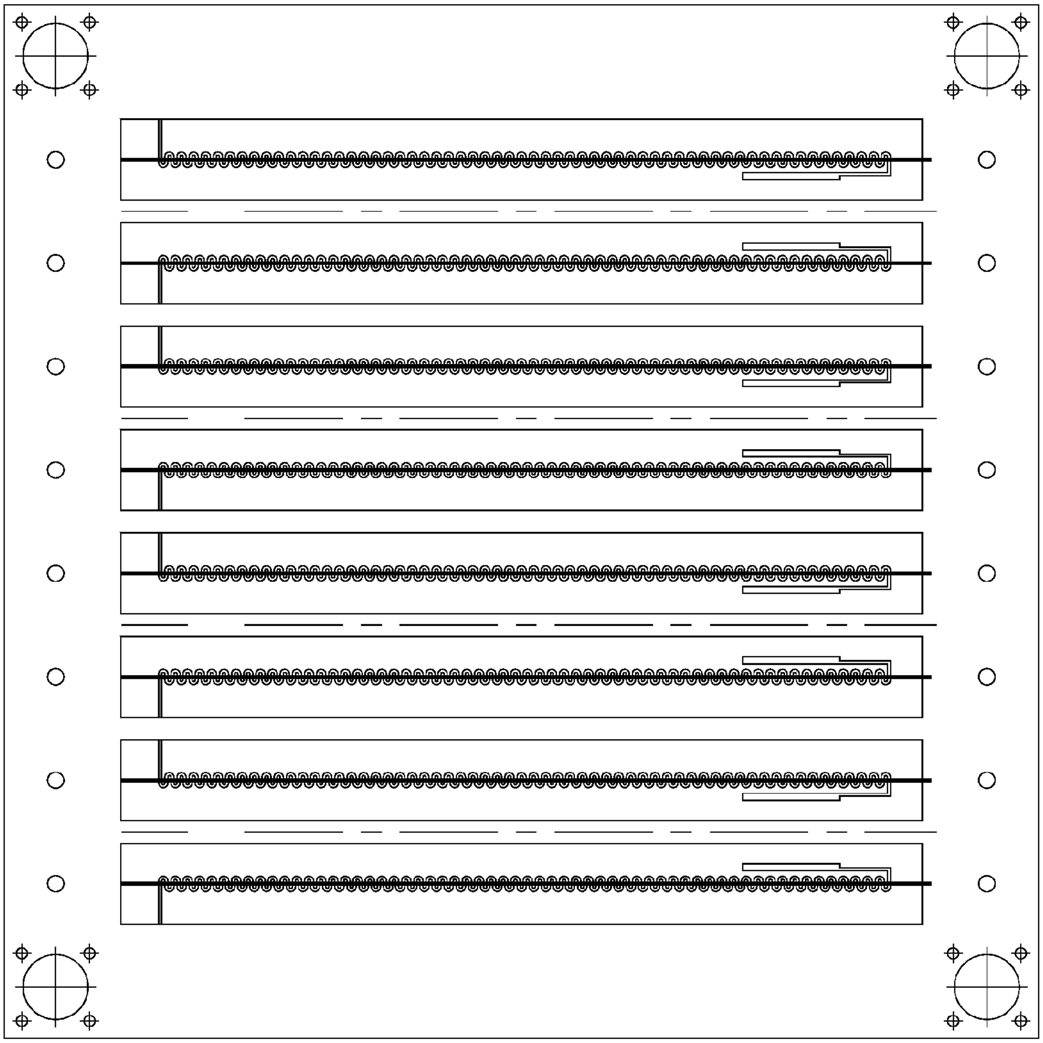
FIG. 10 depicts the plate stock of FIG. 9 with eight half-folded waveguides formed on the plate during manufacturing of a folded waveguide in accordance with some embodiments of the invention.
Figure 11:
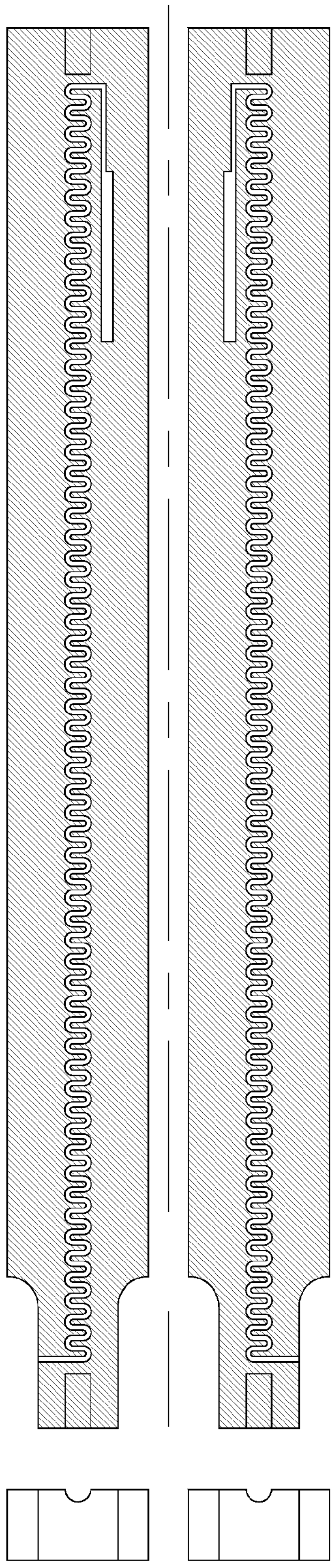
FIG. 11 depicts details of two half-folded waveguides of FIG. 10 in accordance with some embodiments of the invention.
Figure 12A:
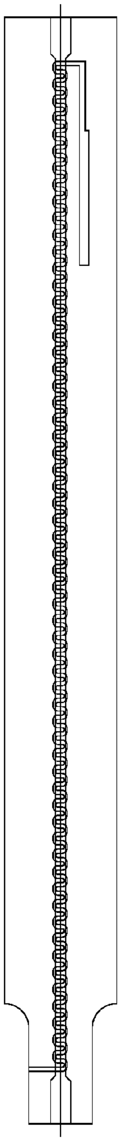
FIGS. 12A and 12B depict various views of the slow wave structure of FIG. 11 after brazing during manufacturing of a folded waveguide in accordance with some embodiments of the invention, where
Figure 12B:
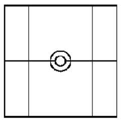
Figure 13B:
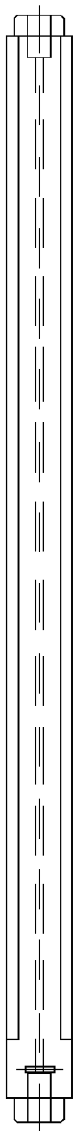
FIGS. 13A-13F depict various views of the slow wave structure of FIGS. 12A and 12B after post-brazing machining during manufacturing of a folded waveguide in accordance with some embodiments of the invention, where
Figure 13E:
Figure 13A:
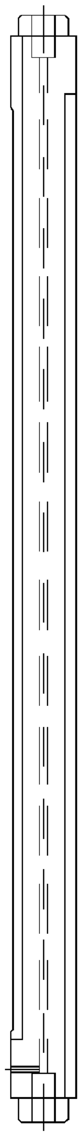
Figure 13D:
Figure 13F:
Figure 13C:
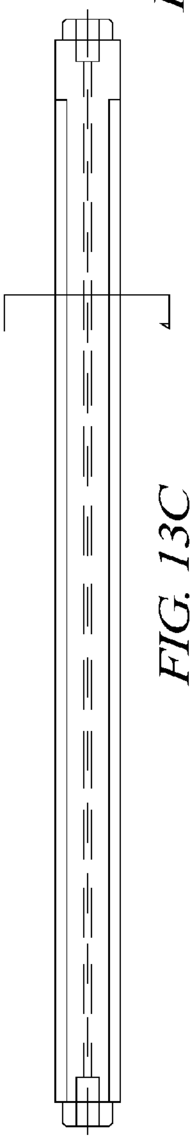
Figure 14A:
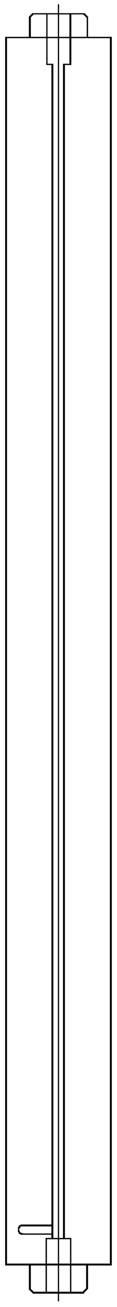
FIGS. 14A and 14B depict a side view and an end view, respectively, of another slow wave structure in accordance with some embodiments of the invention.
Figure 14B:
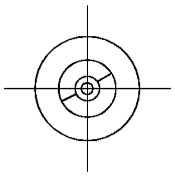
Figure 15:
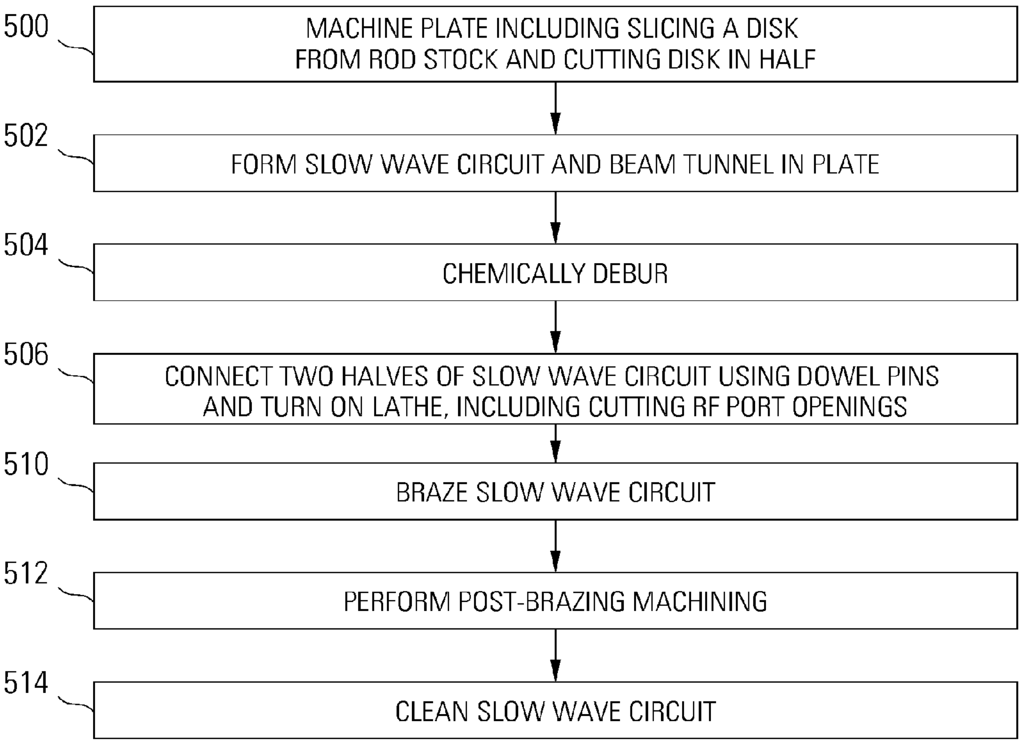
FIG. 15 is a flow chart of a manufacturing process in accordance with some embodiments of the invention.

A flow chart of an example of a manufacturing process in accordance with some embodiments of the invention is illustrated in FIG. 15. In one embodiment, the process is used to manufacture a folded waveguide slow wave circuit used in a W-band TWT. A plate is machined, for example by slicing a rod or forming a plate, etc. (Block 500) For example, using rod stock, one or more disks is sliced from rod stock, both sides of a disk are lapped flat, machine holding mechanisms such as threaded holds are formed in the disk, and the disk is cut in half. (See, e.g., FIGS. 1-3) At least one slow wave circuit (e.g., 46, 47) and beam tunnel is formed in halves in the plate. (Block 502) For example, the disk halves are mounted in a first fixture so that halves can be cut in one set-up. The beam tunnel and slow wave circuit are cut at the same time, along with additional holding mechanisms and pin-holes. In one embodiment, registration marks are all formed in one same fixture set up. The slow wave circuit is machined to the desired depth and width. Redundant trenches may be cut in areas which will be machined off later for inspections. Deburring is performed by repeatedly cutting all features, and the plate and circuits are inspected. Chemical deburring may also be performed. (Block 504) This may be done, for example, by plugging the holding mechanism, threaded holes, and registration holes using rubber plugs, placing parts on a plastic sieve and immersing parts in aluminum etchant such as that from the Transcene company or any other suitable etchant for a suitable period such as for 2 minutes. The parts are rinsed in running deionized (DI) water for 5 minutes. The rubber plugs are removed and the parts are again rinsed in running DI water for one minute, then are inspected. The parts may be turned on the lathe to cut circular openings for RF ports and other lathe tasks as needed. (Block 506) For example, matching halves may be identified, and four dowel pins inserted in the bottom half, with the top half then dropped over the protruding dowel pins to connect the two halves. The part is bolted down into the lathe fixture, and the center line is positioned by inserting an indicator on the lathe machine through the beam tunnel from one end. The fixture is adjusted until the true center is located. The part is then turned on the lathe under low spinning speed and the part is inspected. The halves of the slow wave circuit are connected by brazing or any other suitable technique. (Block 510) For example, the parts may be degreased and a third fixture may be oxidized with SST 304. A brazing gasket may be prepared and brazing stop-off applied. The parts are brazed in the fixture in H2 and a cold test performed. Post-brazing machining may then be performed. (Block 512) For example, the RF ports in the brazed half-disks may be clogged with bees wax, and the beam tunnels clogged with blue dental fillers. The part is mounted to a fourth fixture and machined as needed, such as cutting out individual slow wave circuits and chamfering or turning the outside of the housings in preparation for magnet placement or other needs. The parts may then be inspected, cleaned and tested. (Block 514) For example, The blue dental fillers are removed from both openings of beam tunnel. The RF ports are heated with a heat gun until the bees wax is melted, and the melted bees wax is removed by shaking, blowing, or any other suitable technique from the RF ports. The parts may be immersed in a Teflon container filled with trichloroethylene (TCE) and placed in an ultrasonic bath and agitated as needed, such as for at least 10 minutes. The parts may be rinsed by spraying fresh TCE on part, followed by acetone spray, then dried with a nitrogen blow. The parts are inspected for bees wax residue and operations repeated as necessary until the slow wave circuits are clean and ready for test and use.

While illustrative embodiments have been described in detail herein, it is to be understood that the concepts disclosed herein may be otherwise variously embodied and employed.

What is claimed is:

1. A method of manufacturing a folded waveguide comprising:

machining a plate with a plurality of registration marks;

forming at least one slow wave circuit, wherein the at least one slow wave circuit is formed in at least two halves on the plate, wherein a portion of the plurality of registration marks are for the plate and wherein another portion of the plurality of registration marks are for the at least one slow wave circuit;

dividing the plate into at least two portions, each with a different one of the at least two halves of the at least one slow wave circuit;

connecting the at least two halves of the at least one slow wave circuit of the at least two portions together to yield at least one connected slow wave circuit; and machining the at least one slow wave circuit, wherein the machining comprises cutting out the at least one connected slow wave circuit from the plate.

2. The method of claim 1, further comprising chemically deburring the plate.

3. The method of claim 2, wherein the plate is chemically deburred after dividing the plate into at least two portions.

4. The method of claim 2, wherein the plate is chemically deburred while the plate is an integral whole.

5. The method of claim 1, wherein the plurality of registration marks comprise pin holes, the method further comprising matching halves of the at least one slow wave circuit and aligning the matching halves using dowels in the pin holes.

6. The method of claim 5, wherein connecting the at least two halves of the at least one slow wave circuit comprises connecting the aligned matching halves by brazing to yield a brazed plate segment.

7. The method of claim 6, further comprising turning the brazed plate segment on a lathe to form radio frequency (RF) ports in each slow wave circuit.

8. The method of claim 7, further comprising plugging the RF ports with bees wax and plugging beam tunnels with blue dental fillers.

9. The method of claim 8, wherein cutting out the at least one connected slow wave circuit comprises cutting out each slow wave circuit from the brazed plate segment.

10. The method of claim 9, further comprising turning each slow wave circuit on a lathe in preparation for magnet placement.

11. The method of claim 10, further comprising removing the bees wax and blue dental fillers.

12. The method of claim 10, further comprising cleaning each slow wave circuit in an ultrasonic solvent bath.

13. The method of claim 1, further comprising cutting the plate from rod stock.

14. The method of claim 1, wherein forming the at least one slow wave circuit comprises application of SU-8 and electrolytic plating.

15. The method of claim 1, wherein a plurality of slow wave circuits are formed on the plate, with first halves of the plurality of slow wave circuits being formed on a first half of the plate, and with second halves of the plurality of slow wave circuits being formed on a second half of the plate.

16. The method of claim 1, wherein forming the at least one slow wave circuit comprises micromachining with drill bits.

17. The method of claim 1, wherein a beam tunnel is formed for each of the at least one slow wave circuits as each slow wave circuit is formed.

18. The method of claim 17, wherein at least some of the plurality of registration marks are formed at a same time as the at least one slow wave circuit.

* * * * *